United States Patent
Yaung et al.

(10) Patent No.: US 6,309,905 B1
(45) Date of Patent: Oct. 30, 2001

(54) STRIPE PHOTODIODE ELEMENT WITH HIGH QUANTUM EFFICIENCY FOR AN IMAGE SENSOR CELL

(75) Inventors: Dun-Nian Yaung, Taipei; Shou-Gwo Wuu; Chien-Hsien Tseng, both of Hsinchu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/494,634

(22) Filed: Jan. 31, 2000

(51) Int. Cl.[7] .................................................. H01L 21/00
(52) U.S. Cl. .......................................................... 438/48
(58) Field of Search ................................. 438/48, 73, 57

(56) References Cited

U.S. PATENT DOCUMENTS

| | | | |
|---|---|---|---|
| 5,043,785 | * 8/1991 | Mizutani et al. | 257/443 |
| 5,162,887 | 11/1992 | Dierschke | 257/465 |
| 5,306,906 | * 4/1994 | Aoki et al. | 250/208.1 |
| 5,789,774 | 8/1998 | Merrill | 257/292 |
| 5,859,450 | 1/1999 | Clark et al. | 257/233 |
| 5,904,493 | 5/1999 | Lee et al. | 438/57 |
| 6,005,280 | * 12/1999 | Dierschke et al. | 257/528 |

* cited by examiner

Primary Examiner—Long Pham
Assistant Examiner—William David Coleman
(74) Attorney, Agent, or Firm—George O. Saile; Stephen B. Ackerman

(57) ABSTRACT

A method of fabricating a stripe photodiode element, for an image sensor cell, has been developed. The stripe photodiode element is comprised of a narrow width, serpentine shaped, lightly doped N type region, in a P well region. The use of the serpentine shaped region results in increased photon collection area, when compared to counterparts fabricated using non-serpentine shaped patterns. In addition the use of the serpentine shaped N type regions allow both vertical, as well as horizontal depletion regions, to result, thus increasing the quantum efficiency of the photodiode element. The combination of narrow width, and a reduced dopant level, for the N type serpentine shaped region, result in a fully depleted photodiode element.

6 Claims, 3 Drawing Sheets

STRIPE PHOTODIODE ELEMENT WITH HIGH QUANTUM EFFICIENCY FOR AN IMAGE SENSOR CELL

BACKGROUND OF THE INVENTION (1) Field of the Invention

The present invention relates to methods used to fabricate semiconductor devices, and more specifically to a method used to fabricate a stripe photodiode element for an image sensor cell.

(2) Description of Prior Art

Active pixel, or image sensor cells, are usually comprised with a photodiode element, used to collect photon energy for the cell. The efficiency of the photon collector, or the photodiode element, usually comprised of a N/P diode, is directly related to the depletion region of this diode. The depletion region in turn is a function of the doping level of the components of the N/P photodiode element, as well as the area of the photodiode. However trends to micro-miniaturization have resulted in decreasing space allotted for the image censor cell, and thus smaller, less efficient photodiode elements are used.

Prior art, such as Merrill, in U.S. Pat. No. 5,789,774, as well as Lee et al, in U.S. Pat. No. 5,904,493, describe methods of fabricating active pixel cells, however these prior arts do not describe active pixel cells featuring a stripe photodiode design, and the method used to fabricate this type of photodiode element, now described in the present invention.

SUMMARY OF THE INVENTION

It is an object of this invention to fabricate an image sensor cell featuring a photodiode element configured with a stripe, or serpentine type, design.

It is another object of this invention to fabricate the stripe photodiode element by forming a serpentine type, N type region, in a P well region.

It is still another object of this invention to increase the depletion region of the stripe photodiode element via reducing the doping concentration of the N type region of the stripe photodiode element.

It is still yet another object of this invention to design the width of the N type serpentine like region nearly equal to the depletion width of the junction, so that vertical feature of the photodiode structure is fully depleted.

In accordance with the present invention a method of fabricating a stripe photodiode element, for an image sensor cell, featuring a low dopant concentration, N type serpentine type region, in a P well region, is described. After forming a P well region, in a top portion of a P type semiconductor substrate, a serpentine like, N type region is formed in a top portion of the P well region, via conventional photolithographic masking, and ion implantation procedures, creating the stripe photodiode element. A low doping concentration is used for the N type serpentine type region, allowing an increased depletion region to be achieved. In addition the width of the N type serpentine type region is designed with a width equal to the width of the photodiode depletion region. A heavily doped. P type region, used for a low resistance contact region, is formed in the P well region of the photodiode element, while a heavily doped N type region is formed in the N type serpentine like region, again for use as a low resistance contact region.

This invention will describe a stripe design, as well as a process for fabricating, a stripe photodiode element, featuring a serpentine like, lightly doped N type region, located in a P well region. The use of this type of photodiode element, comprised with serpentine like N type region, in a P well region, increases the area of the photon collector, via use of the three dimensional interface between the elements of the diode. In addition to the increased area of the photodiode element, the concentration of the N type serpentine pattern is reduced, also allowing an increased depletion region to result. The result of the additional collector, or photon collector area, as well as the increase in depletion region as a result of a reduction in doping levels, translates to increased quantum efficiency, for the photodiode element, when compared to counterparts fabricated with two dimensional photodiode structures, and fabricated with higher doping levels for the photodiode regions.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
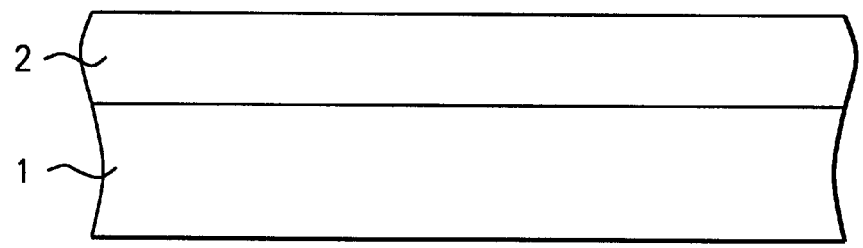
FIGS. 1, 2, 3B, 4B and 4C, which schematically, in cross-sectional style, show key stages of fabrication used to create the stripe photodiode element, of an image sensor cell.

The method of fabricating a stripe photodiode element, for an image sensor cell, will now be described in detail. A P type, semiconductor substrate 1, comprised of single crystalline silicon, with a <100> crystallographic orientation, is used and shown schematically in FIG. 1. P well region 2, is next formed in a top portion of semiconductor substrate 1, via implantation of boron ons, at an energy between about 160 to 200 KeV, at a dose between about 5E12 to 1.5E13 atoms/cm$^2$. The P type dopant concentration of P well region 2, is greater than the P type dopant concentration in semiconductor substrate 1.

Figure 2:
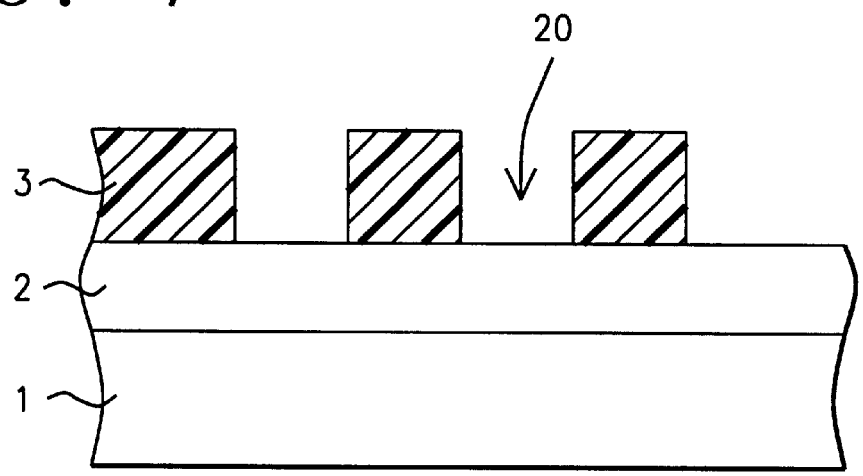
Figure 3A:
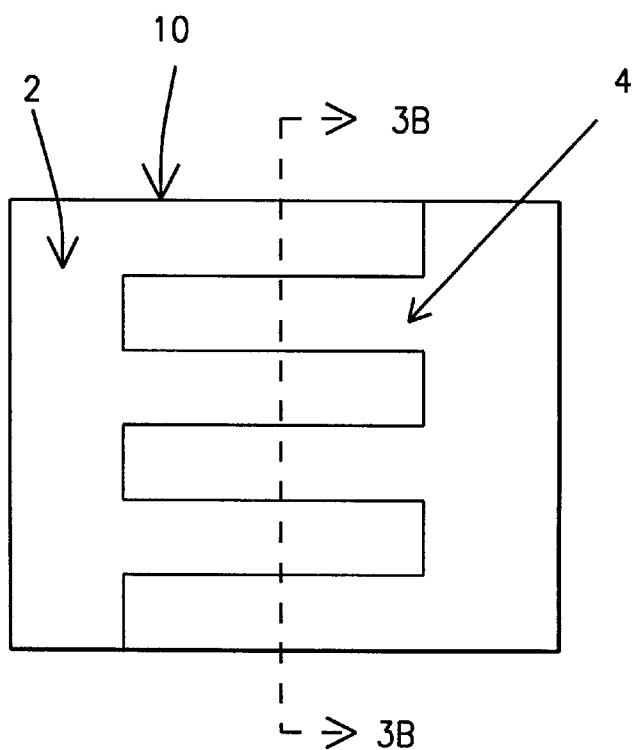
FIGS. 3A and 4A, which schematically show a top view of the stripe photodiode element at specific stages of fabrication.
Figure 3B:
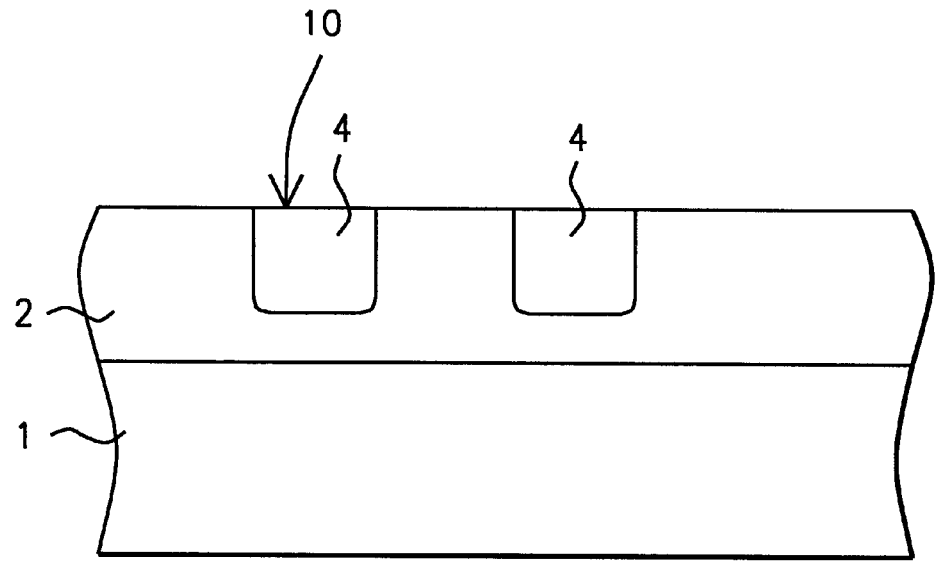

Photoresist shape 3, is next defined, featuring openings 20, which expose a portion of the top surface of P well region 2. Openings 20, shown schematically in FIG. 2, are defined with a serpentine pattern, with the width of opening 20, between about 0.4 to 0.6 um. An ion implantation procedure, using arsenic, or phosphorous ions, is next performed resulting in N type region 4, shown in cross-sectional style, in FIG. 3B, or schematically in the top view presented in FIG. 3A. The width of N type region 4, defined using photoresist shapes 3, with openings 20, as a mask, is between about 0.4 to 0.6 um. N type region 4, is a lightly doped region, obtained via implantation of phosphorous ions, at an energy between about 400 to 500 KeY, at a dose between about 5E12 to 1.5E13 atoms/cm$^2$. Photoresist shape 3, is then removed via plasma oxygen ashing and careful wet cleans.

The use of the serpentine pattern, for N type region 4, allows stripe photodiode element 10, comprised of N type region 4–P well region 2, to be comprised with a greater surface area than counterpart diode elements fabricated without serpentine regions. The additional surface area results in an increase in photon collection for the stripe photodiode element, without increasing the area of the image sensor cell. The low doping level of N type region 4, also allows the depletion region of the photodiode to be increased, when compared to photodiode elements formed using more heavily doped N type regions. In addition vertical, as well as horizontal, depletion regions are formed via the stripe photodiode element, again resulting in depletion region increases, translating into greater quantum efficiency. Finally the width of the N type region 4, is chosen to be approximately equal to the width of the depletion width of the N/P junction, so that this region of the photodiode element is fully depleted, even in the vertical direction, not only on the plane of the junction.

Figure 4A:
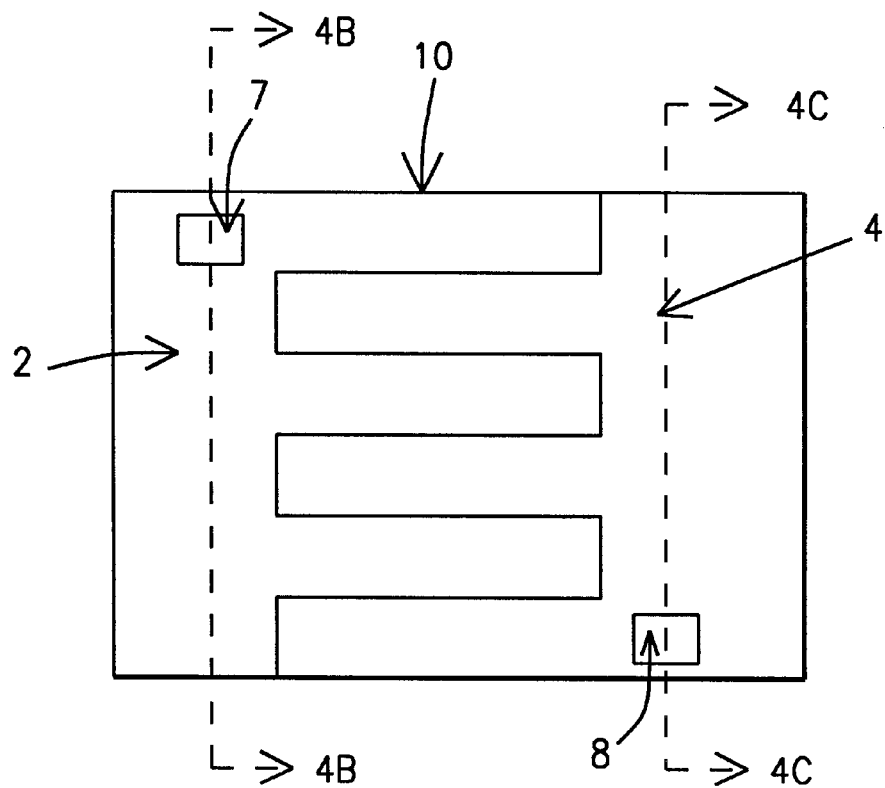
Figure 4B:
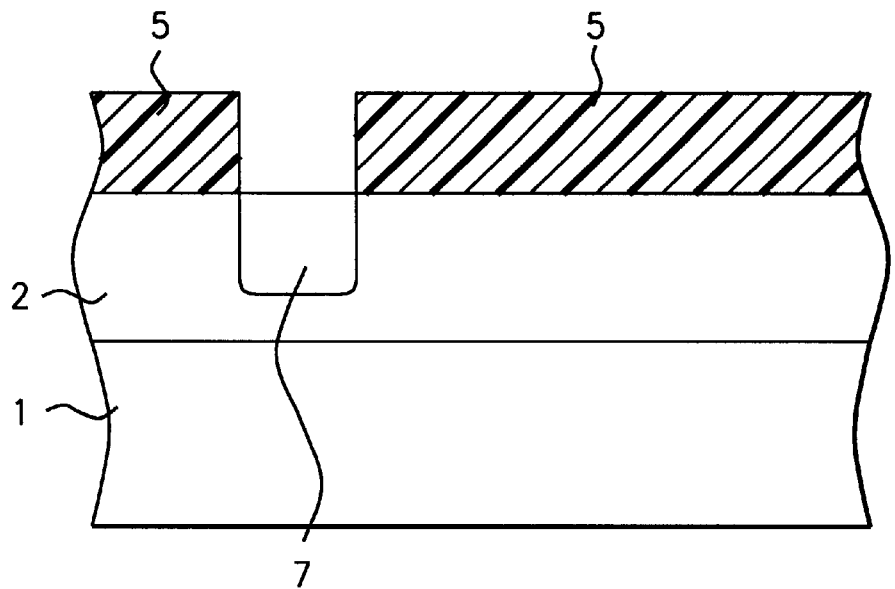
Figure 4C:
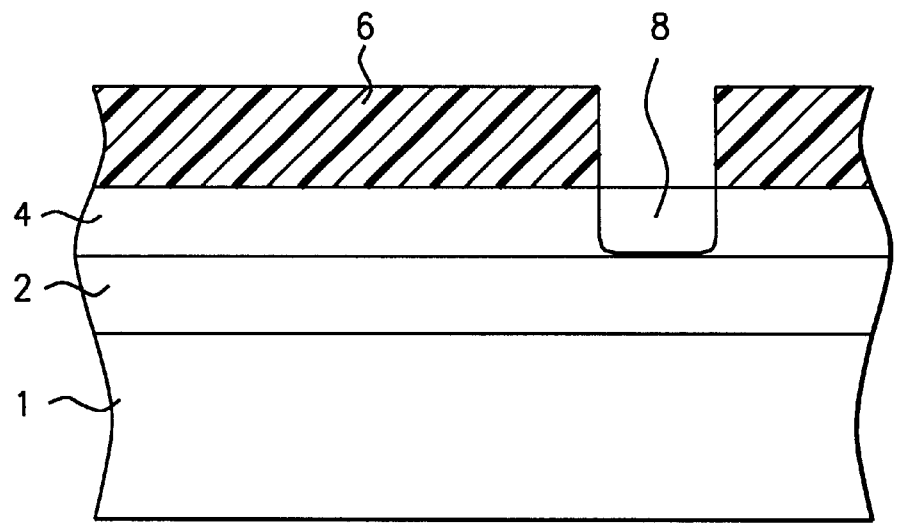

Heavily doped contact regions for stripe photodiode element 10, are next addressed, and schematically shown in cross-sectional style in FIGS. 4B, and 4C. Referring to FIG. 4B, photoresist shape 5, is used as a mask to allow ion implantation of boron, or $BF_2$ ions, performed at an energy between about 20 to 50 KeV, at a dose between about 2E15 to 6E15 atoms/cm$^2$, to create heavily doped P type region 7, in P well region 2. Heavily doped P type region 7, will be used as a contact region for the P type element of stripe photodiode element 10. After removal of photoresist shape 5, via plasma oxygen ashing and careful wet clean procedures, photoresist shape 6, shown schematically in FIG. 4C, is defined, and used as a mask to allow heavily doped N type region 8, to be formed in a region of N type region 4. Heavily doped N type region 8, to be used as contact region for the N type element of stripe photodiode element 10, is formed via ion implantation of arsenic or phosphorous ions, at an energy between about 39 to 70 KeV, at a dose between about 2E15 to 6E15 atoms/cm$^2$. Photoresist shape 6, is then removed via plasma oxygen ashing and careful wet clean procedures. FIG. 4A, schematically shows a top view of stripe photodiode element 10, featuring serpentine like, N type region 4, in P well region 2, resulting in increased photon collector area. Also shown in FIG. 4A, are heavily doped contact regions 6, and 8, allowing subsequent low resistance contacts to these regions of stripe photodiode element 10, to be formed.

While this invention has been particularly shown and described with reference to, the preferred embodiments thereof, it will be understood by those skilled in the art that various changes in form and details may be made without departing from the spirit or scope of this invention.

What is claimed is:

1. A method of fabricating a stripe photodiode element, for an image sensor cell, on a semiconductor substrate, featuring a lightly doped, narrow width, serpentine shaped, N type region, in a P well region, comprising the steps of:

performing a first ion implantation procedure, to form said P well region, in said image sensor cell region, of said semiconductor substrate;

forming a photoresist shape on said P well region;

performing a second ion implantation procedure, to form said lightly doped, narrow width, serpentine shaped, N type region, in a first portion of said P well region, exposed in openings in said photoresist shape, creating said stripe photodiode element, comprised of said lightly doped, narrow width, serpentine shaped, N type region, in said first portion of said P well region;

performing a third ion implantation procedure to form a heavily doped, P type contact region, in a second portion of said P well region; and performing a fourth ion implantation procedure to form a heavily doped, N type contact region, in a portion of said lightly doped, narrow width, serpentine shaped, N type region.

2. The method of claim 1, wherein said first ion implantation procedure, used to form said P well region, is performed using boron ions, at an energy between about 160 to 200 KeV, at a dose between about 5E12 to 1.5E 13 atoms/cm$^2$.

3. The method of claim 1, wherein said second ion implantation procedure, used to create said lightly doped, narrow width, serpentine shaped, N type region, is performed using phosphorous ions, at an energy between about 400 to 500 KeV, at a dose between about 5E12 to 1.5E13 atoms/cm$^2$.

4. The method of claim 1, wherein the width of said lightly doped, narrow width, serpentine shaped, N type region, is between about 0.4 to 0.6 um.

5. The method of claim 1, wherein said third ion implantation procedure, used to create said heavily doped, P type contact region, is performed using boron or $BF_2$ ions, at an energy between about 20 to 50 KeV, at a dose between about 2E15 to 6E15 atoms/cm$^2$.

6. The method of claim 1, wherein said fourth ion implantation procedure, used to form said N type, contact region, is performed using arsenic, or phosphorous ions, at an energy between about 30 to 70 KeV, at a dose between about 2E15 to 6E15 atoms/cm$^2$.

* * * * *